United States Patent [19]

Cerny, Jr. et al.

[11] 3,729,688

[45] Apr. 24, 1973

[54] OSCILLATOR WITH SWITCHABLE FILTER CONTROL VOLTAGE INPUT FOR RAPIDLY SWITCHING TO DISCRETE FREQUENCY OUTPUTS

[75] Inventors: Frank J. Cerny, Jr., N. Riverside; Donald L. Linder, Elmhurst, both of Ill.

[73] Assignee: Motorola, Inc., Franklin Park, Ill.

[22] Filed: Dec. 15, 1971

[21] Appl. No.: 208,349

[52] U.S. Cl. ..........................331/1 A, 331/8, 331/17, 331/25, 331/179

[51] Int. Cl. ..........................H03b 3/04

[58] Field of Search ..........................331/1 A, 8, 17, 18, 331/25, 177 V, 179

[56] References Cited

UNITED STATES PATENTS

| | | | |
|---|---|---|---|
| 3,505,620 | 4/1970 | Miner | 331/177 V X |
| 3,626,330 | 12/1971 | Zalonis | 331/179 X |
| 3,328,719 | 6/1967 | De Lisle et al. | 331/17 |

*Primary Examiner*—Roy Lake
*Assistant Examiner*—Siegfried H. Grimm
*Attorney*—Vincent Rauner et al.

[57] ABSTRACT

A voltage controlled oscillator controllable to discrete frequency outputs, which outputs are applied to a phase detector through divider circuits and compared to a reference signal of the same frequency, is controlled to discrete frequency outputs by variable voltages or variable width pulses, proportional to the difference in phase between the two signals, from the phase detector which pulses are applied to the oscillator through loop filters. Each loop filter is an RC circuit which integrates the pulses and serves as a memory to retain a relatively constant voltage thereacross. Therefore, when a specific loop filter is switched into the circuit the voltage controlled oscillator is rapidly switched to a discrete frequency output proportional to the voltage stored in the loop filter.

7 Claims, 2 Drawing Figures

OSCILLATOR WITH SWITCHABLE FILTER CONTROL VOLTAGE INPUT FOR RAPIDLY SWITCHING TO DISCRETE FREQUENCY OUTPUTS

BACKGROUND OF THE INVENTION

1. Field of the Invention

In the electronics field and especially in communications and the like, it is often necessary to provide a plurality of discrete frequencies, which frequencies must be relatively stable or constant. In the past, a plurality of discrete frequencies were provided by crystal oscillators utilizing a plurality of different crystals each resonant at one of the desired frequencies. However, it is relatively costly to provide the plurality of crystals resonant at the desired frequencies. Therefore, digital synthesizers have been developed which are capable of providing a plurality of stable frequencies utilizing a single crystal oscillator.

However, the digital synthesizer is relatively slow when switched between discrete frequencies because a voltage controlled oscillator, with a low pass loop filter generally incorporating voltage sensitive reactances to alter the frequency thereof, is utilized. To switch the oscillator from one discrete frequency to another requires the alteration of the control voltage applied to the oscillator. The voltage controlled oscillator is normally incorporated in a closed loop which samples the output frequency and feeds the frequency back to circuitry for producing the control voltage. This circuitry contains a loop filter having a small bandwidth for proper circuit performance. However, because of the small bandwidth, the loop filter has a relatively long time constant which produces a relatively long delay whenever an attempt is made to change the control voltage.

2. Description of the Prior Art

In prior art digital synthesizers, the amount of time required for the synthesizer to lock onto a selected frequency is reduced by use of adaptive loop filters. Adaptive loop filters are filters having variable time constants, which time constants change with the amount of voltage across the filter. The adaptive loop filters are connected into the circuit so that the time constant is relatively small while the loop is adjusting to a new control voltage and the time constant becomes relatively long when the circuit has locked onto the desired frequency. A typical example of adaptive loop filters is described in U. S. Pat. No. 3,300,731, entitled "Digital Frequency Synthesizer Having A Plurality Of Selectably Connectable Phase Locked Digit Insertion Units." While the use of adaptive loop filters will reduce the time required to lock onto a desired frequency, the required time is still too long to effectively utilize the circuitry in circuitry having channel scanning apparatus and the like.

SUMMARY OF THE INVENTION

The present invention pertains to apparatus rapidly controllable to discrete frequency outputs including voltage controlled oscillator means having a plurality of voltage storage means connectable thereto, each adapted to have a different voltage developed thereacross for controlling said oscillator means to a discrete frequency, and switching means for selectively connecting one of said voltage storage means to the oscillator means.

It is an object of the present invention to provide apparatus, such as digital frequency synthesizers, rapidly controllable to discrete frequency outputs.

It is a further object of the present invention to provide voltage controlled oscillator means incorporated in a closed loop having a plurality of loop filters individually connectable therein and each adapted to store a different voltage level, for rapidly controlling the oscillator to a discrete frequency proportional to the stored voltage upon connection of any one of the loop filters into the closed loop.

It is a further object of the present invention to provide an improved digital synthesizer, which can be rapidly controlled to discrete frequency outputs, for use in channel scanning apparatus and the like.

These and other objects of the invention will become apparent to those skilled in the art upon consideration of the accompanying specification, claims and drawings.

BRIEF DESCRIPTION OF THE DRAWINGS

Referring to the drawings, wherein like characters indicate like parts throughout the figures.

DESCRIPTION OF THE PREFERRED EMBODIMENT

Figure 1:
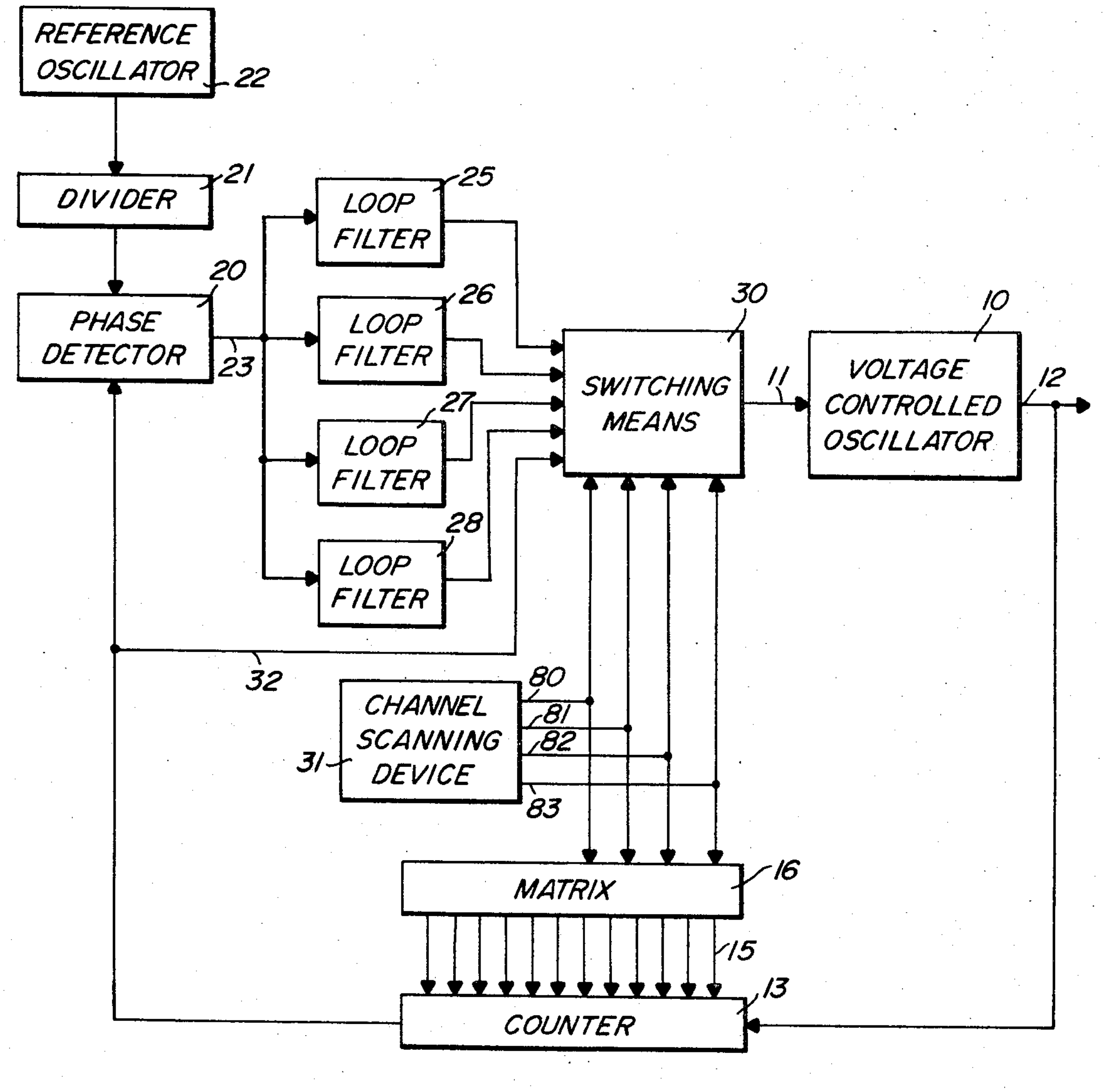
FIG. 1 is a block diagram of a digital frequency synthesizer embodying the present invention and incorporating channel scanning circuitry.

Referring specifically to FIG. 1, the numeral 10 designates a voltage controlled oscillator, which may be any oscillator well known to those skilled in the art capable of providing a variable frequency output proportional to a variable control voltage applied thereto. In general, the voltage controlled oscillator 10 may be the type utilizing variable reactance devices, such as variable reactance diodes, which vary in reactance in response to voltages applied thereacross to vary tuned circuits or the like in the oscillator 10. The oscillator 10 has an input 11 for receiving a control voltage thereon and an output 12, which is connected to an output terminal for use with additional equipment (not shown) and to an input of a counter 13. Counter 13 operates as a divider to reduce the frequency of the signal applied to the input thereof to a basic frequency which is a sub-multiple of the applied frequency. The amount of division performed by the counter 13 is determined by the connection of a plurality of programming leads 15 which connect a matrix 16 to the counter 13.

The output signal from the counter 13 is applied to an input of a comparing means, which in this embodiment is a phase detector 20. The phase detector 20 is utilized in this embodiment as the comparing means because of its simplicity and reliability, however, it should be understood that other devices might be utilized, such as a frequency detector, a frequency discriminator, a frequency comparator, etc. A second input of the phase detector 20 is connected to the output of a divider circuit 21 which is connected to receive a reference frequency from a reference oscillator 22. The reference oscillator 22 is a relatively stable oscillator, such as a crystal oscillator or the like, and the divider 21 supplies a sub-multiple of the reference frequency for comparison to the output of the counter 13. In this embodiment the phase detector 20 provides output pulses which have a variable width. The width of the output pulses from the phase detector 20 is proportional to the difference in phase between the signal from the counter 13 and the signal from the divider 21.

The output pulses from the phase detector 20 are supplied, on a lead 23, to four loop filters 25 through 28, which are in turn connected through a switching means 30 to the input 11 of the voltage controlled oscillator 10. Only one of the loop filters 25–28 is connected into the circuit at any one time and the specific loop filter 25–28 which is connected into the circuit is determined by a channel scan device 31. The present apparatus is illustrated with four channels, or discrete frequencies, for illustrative purposes but it should be understood that any number of channels might be utilized and the apparatus would operate in a fashion similar to the described operation. Each time the channel scan device 31 operates the switching means 30, a different loop filter 25–28 is switched into the circuit and the matrix 16 is switched so that the counter 13 divides the resulting frequency from the voltage controlled oscillator 10 to the desired submultiple which is approximately equal to the frequency provided by the reference oscillator 22 and divider 21.

The output of the counter 13 is also supplied, on a lead 32, to the switching means 30. The switching means 30 is constructed (as will be described in more detail presently) so that a new loop filter 25–28 can only be switched into the circuit subsequent to the occurrence of a pulse or signal at the output of the counter 13. The width of the pulses provided at the output of the phase detector 20 are dependent upon the phase relationship between the frequency of the signal from the divider 21 and the frequency of the signal from the counter 13. The frequency of the signal from the counter 13 is dependent upon the programming of the matrix 16. It can readily be seen that any sudden shift in the frequency of the signal supplied by the voltage controlled oscillator 10, such as by switching loop filters 25–28, when the counter 13 is in the process of counting can greatly alter the phase relationship between the signal supplied by the counter 13 and the signal supplied by the divider 21. Thus, the width of the pulse from the phase detector 20 to the loop filter 25–28 in the circuit may be extremely small or large and may not represent the difference in phase between the signals. Therefore, it is desirable for proper and speedy operation of the circuitry to switch loop filters 25–28 only after the counter 13 has finished a count and prior to starting the next count. It is also possible to obtain the clock signal for the switching means 30 from the reference divider 21 instead, since the outputs from dividers 13 and 21 will be in phase with each other when the synthesizer is operative or phase locked.

Figure 2:
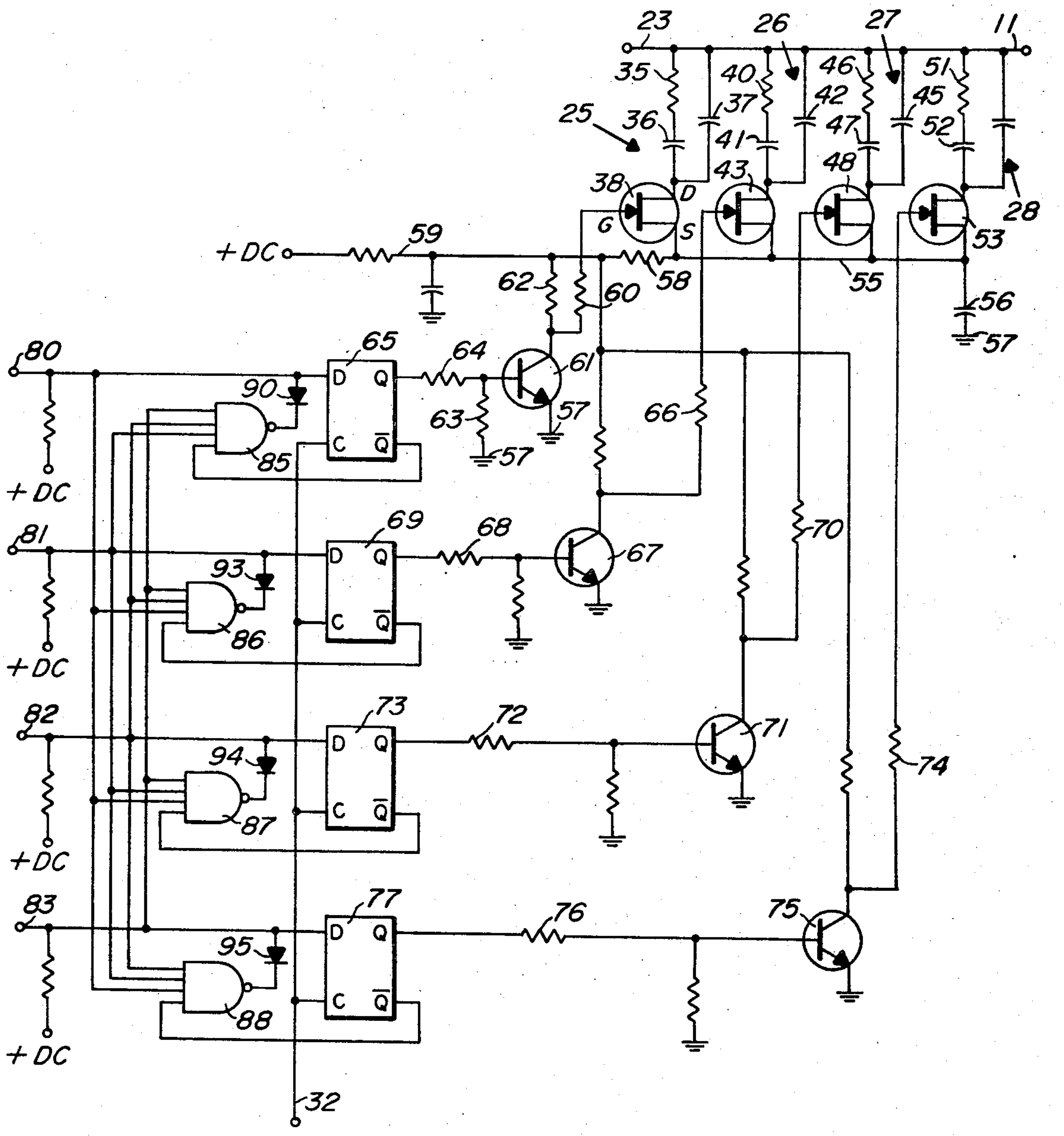
FIG. 2 is a schematic diagram of a portion of the apparatus illustrated in block form in FIG. 1.

Referring specifically to FIG. 2, a schematic diagram of one embodiment of the loop filters 25–28 and the switching means 30 is illustrated. The output lead 23 from the phase detector 20 is connected directly to the input lead 11 of the voltage controlled oscillator 10. Loop filter 25 includes a resistor 35 and capacitor 36 connected in series and in parallel with a capacitor 37. The junction of the resistor 35 and capacitor 37 is connected to the lead 23 and the junction of the capacitor 36 and the capacitor 37 is connected to the drain of a field effect transistor 38. (Without the channel scanning circuitry this point would instead go directly to ground). In a similar fashion, the loop filter 26 includes the parallel connection of a capacitor 42 and a series connected resistor 40 and capacitor 41 connected between the line 23 and the drain of a field effect transistor 43. Similarly, the loop filter 27 includes the parallel connection of a capacitor 45 and a series connected resistor 46 and capacitor 47 connected between the line 23 and the drain of a field effect transistor 48. The last loop filter 28 (in this embodiment) includes the parallel connection of a capacitor 50 with a series connected resistor 51 and capacitor 52 connected between the line 23 and the drain of a field effect transistor 53. It should be understood that the size of the various components in the filters 25–28 depends upon the particular frequencies it is desired to produce by the synthesizer as well as the various other requirements such as noise performance and the like. In the present embodiment the synthesizer is designed to produce frequencies around 450 MHz and the preferred bandwidth for the loop filters is in the order of 125 Hz or less. Typical examples of component size which provide these features are: resistor 35 equals 15 K ohms, capacitor 36 equals 0.22 microfarads and capacitor 37 equals 0.03 microfarads. The capacitors and resistors forming the remaining loop filters 26, 27 and 28 will be of comparable sizes.

The sources of each of the field effect transistors 38, 43, 48 and 53 are connected to a bus line 55, one end of which is connected through a by-pass capacitor 56 to a common or ground point 57 and the other end of which is connected through a resistor 58 to the output of a filter 59 for a regulated voltage supply (not shown). In the present embodiment the regulated voltage supply may be on the order of 9 volts and the voltage on the line 23 varies between approximately 1 and 6 volts. It should be understood, of course, that these values are exemplary and are chosen for the specific components utilized in the present circuit.

The gate of the field effect transistor 38 is connected through a resistor 60 to the collector of a switching transistor 61. The collector of the transistor 61 is also connected through a resistor 62 to the output of the filter 59. The emitter of the transistor 61 is connected directly to ground 57 and the base is connected through a biasing resistor 63 to ground 57. The base of the transistor 61 is also connected through a resistor 64 to the Q output of a type D flip-flop 65. The type D flip-flop 65 is an IC circuit, the operation of which is well known to those skilled in the art, and includes the Q output, a $\overline{Q}$ output, a D input and a C (clock) input. The operation of the flip-flop 65 is such that the Q output level always goes to the same level as the D input (high or low) upon the application of a clock pulse to the C input and remains at that level until the application of the next clock pulse to the C input. The $\overline{Q}$ output is always the opposite of the Q output. The gate of the field effect transistor 43 is connected through a resistor 66 to the collector of a switching transistor 67, the base of which is connected through a resistor 68 to the Q output of a second D type flip-flop 69. The gate of the field effect transistor 48 is connected through a resistor 70 to the collector of a switching transistor 71, the base of which is connected through a resistor 72 to the Q output of a third D type flip-flop 73. The gate of the field effect transistor 53 is connected through a resistor 74 to the collector of a switching transistor 75, the base of which is connected through a resistor 76 to the Q output of a fourth D type flip-flop 77. All of the switching transistors 61, 67, 71 and 75 are connected with similar biasing and limiting resistors all of which will not be explained in detail. Also, all of the D type flip-flops 65, 69, 73 and 77 are similar and include similar inputs and outputs.

The D inputs of the flip-flops 65, 69, 73 and 77 are connected to the channel scanning device 31 directly by leads 80, 81, 82 and 83, respectively. Four NAND gates 85 through 88, each having four inputs and an output are interconnected in the following manner. The first three inputs of gate 85 are connected to leads 81, 82 and 83 and the fourth input is connected to the $\overline{Q}$ output of the flip-flop 65. The output of the gate 85 is connected to the cathode of a semiconductor diode 90, the anode of which is connected to the lead 80. The first three inputs of the gate 86 are connected to the leads 80, 82 and 83 and the fourth input is connected to the $\overline{Q}$ output of the flip-flop 69. The output of the gate 86 is connected to the cathode of a semiconductor diode 93, the anode of which is connected to the lead 81. The first three inputs of the gate 87 are connected to the leads 80, 81 and 83 and the fourth input is connected to the $\overline{Q}$ output of the flip-flop 73. The output of the gate 87 is connected to the cathode of a semiconductor diode 94, the anode of which is connected to the lead 82. The first three inputs of the gate 88 are connected to the leads 80, 81 and 82 and the fourth input is connected to the $\overline{Q}$ output of the flip-flop 77. The output of the gate 88 is connected to the cathode of a semi-conductor diode 95, the anode of which is connected to the lead 83. Each of the C inputs of the flip-flops 65, 69, 73 and 77 is connected to the output of the counter 13 by the lead 32.

In the operation of the described circuits, the channel scanning device 31 provides a low level signal on one of the leads 80–83 and high level signals on the remaining three leads. During scanning operations the signal level at each of the leads 80–83 is periodically low while the remaining three leads are high. With a low level signal on the lead 80, a low level signal is presented to the D input of the flip-flop 65. When a clock pulse appears at the input C the Q output drops to a low level and the $\overline{Q}$ output goes to a high level. The high level signal at the $\overline{Q}$ output is applied to the fourth input of the gate 85 so that all of the inputs are high and the output is low. The low output at the gate 85 turns the diode 90 on and retains the flip-flop 65 in the described operating condition. The clock pulses on the lead 32 are of a substantially higher frequency than the channel scanning pulses applied to the leads 80–83 and the NAND gates 85–88 are utilized to maintain a single flip-flop 65, 69, 73 or 77 in the properly energized state at all times. Because of a slight natural delay between the rising of the signal level on the lead 80 (or any of the leads 81–83) and the lowering of the signal level on the lead 81, the relatively high speed clock pulses could switch the flip-flop 65 before the flip-flop 69 is switched to the desired operating state. However, in the present circuit the NAND gate 85 and the diode 90 maintain the flip-flop 65 in the correct state until the signal on the lead 81 has dropped to a sufficiently low level to cause the flip-flop 69 to switch to the desired state. It should be understood that other circuitry might be utilized to perform this function and the present NAND gates and flip-flops are illustrated for exemplary purposes.

When the Q output of the flip-flop 65 drops to a low level, the switching transistor 61 turns off and the collector voltage rises, raising the voltage on the gate of the field effect transistor 38. When the gate of the field effect transistor 38 becomes the same voltage as the source (zero gate bias) the transistor 38 conducts completing a circuit through the filter 25 from the output of the phase detector 23 and the input of the voltage controlled oscillator 10 to the positive voltage line 55 which is bypassed to ground for all frequencies. Since the remaining flip-flops 69, 73 and 77 all have a high level signal applied to the D input thereof, the Q outputs are high, the switching transistors 67, 71 and 75 are conducting and the gates of the field effect transistors 43, 48 and 53 are near ground so that the field effect transistors are nonconducting or high impedance devices. Each time a low level signal is applied to one of the leads 80, 81, 82 or 83 the associated flip-flop changes state, upon the application of a clock pulse, and turns off the associated switching transistor to turn on the associated field effect transistor and connect one of the loop filters 25, 26, 27 or 28 into the circuit. The field effect transistors perform very high speed substantially transientless switching so that a loop filter can be switched out of the circuit and a new one switched in subsequent to the completion of a count in the counter 13 and prior to the beginning of a new count (for the reason stated above). Whenever the channel scanning device 31 activates the switching means 30 to connect a new loop filter 25–28 into the circuit it also activates the matrix 16 to alter the counter 13 through the programming leads 15 so that the output of the counter 13 applied to the phase detector 20 remains at substantially the same frequency even through the frequency of the output at the voltage controlled oscillator 10 is changed by the new loop filter 25–28.

With a particular loop filter, for example 25, connected into the circuit, the pulses from the phase detector 20 are applied thereto on the line 23. As described above, the width of the pulses and, therefore, the energy content depends upon the phase relationship between the signals from the divider 21 and the signals from the counter 13. The variable width pulses on the line 23 cause the capacitors 36 and 37 in the filter 25 to begin charging toward a required control voltage. The required control voltage is the voltage necessary on line 23 (and the input 11 of the voltage controlled oscillator 10) to control the oscillator 10 to produce a signal having a frequency which when applied through the counter 13 to the phase detector 20 will be in phase with the signal applied from the divider 21. Because the channel scanning device 31 operates very rapidly, the capacitors 36 and 37 may not have sufficient time to charge to the required control voltage (when the synthesizer is first turned on and the initial charge thereon is zero) before the filter 25 is switched out of the circuit. Therefore, two or three scans of all of the channels may be required before the capacitors in each of the loop filters 25–28 reach the required control voltages. Once the several cycles or scans have been completed, the loop filters 25–28 will each be charged to approximately the control voltage required to control the oscillator to the discrete frequency for each of the four channels. Upon reaching the required control voltage the filters 25–28 will retain this voltage, even though they are switched out of the circuit, because the field effect transistors 38, 43, 48 and 53 present a very high impedance and the RC discharge time of the capacitors, for example capacitors 36 and 37, through the associated resistor (35) is very long. Thus, after the first few scans required to bring the voltage in the filters up to the required control voltage, the control voltage is retained in the filters and each time a loop filter 25–28 is switched into the circuit the voltage thereacross is immediately applied to the input 11 of the voltage controlled oscillator 10. The voltage retained in the loop filters 25–28 is sufficiently close to the required control voltage to control the oscillator 10 to substantially the desired discrete frequency approximately instantaneously. In tests it has been found that the described circuitry will switch between adjacent channels and lock on the discrete frequency in approximately one-half millisecond, in a system where the channels are 25 KHz apart. Utilizing a single filter in the circuitry and changing the voltage thereacross for the different channels requires at least 7 milliseconds to lock onto a new channel adjacent an old channel. Thus, it can be seen that the present circuitry provides a substantial reduction in time required to lock onto a new channel.

Thus, apparatus which is rapidly controllable to discrete frequency outputs is disclosed wherein a plurality of voltage storage means, which may be loop filters or the like, are periodically and individually connected to the input of a voltage controlled oscillator to alter the control voltage on the oscillator in steps, rather than continuously. Thus, the oscillator moves from one discrete frequency to substantially a second discrete frequency without passing gradually through all of the frequencies therebetween. The present apparatus is relatively simple and reliable while being extremely fast relative to prior art apparatus. While we have shown and described a specific embodiment of this invention, further modifications and improvements will occur to those skilled in the art. We desire it to be understood, therefore, that this invention is not limited to the particular form shown and we intend in the appended claims to cover all modifications which do not depart from the spirit and scope of this invention.

We claim:

1. Apparatus rapidly controllable to discrete frequency outputs comprising:

a. voltage controlled oscillator means having an input adapted to have a voltage applied thereto and an output providing a signal dependent upon the amplitude of voltage applied to the input;

b. a plurality of voltage storage means each including a filter having a relatively small bandwidth and each adapted to have a different voltage thereacross for controlling said oscillator means to a discrete frequency; and c. switching means for selectively connecting one of said voltage storage means to the input of said oscillator means.

2. Apparatus as set forth in claim 1 wherein the switching means includes a field effect transistor for each voltage storage means.

3. Apparatus rapidly controllable to discrete frequency outputs comprising:

a. voltage controlled oscillator means having an input adapted to have a voltage applied thereto and an output providing a signal dependent upon the amplitude of voltage applied to the input;

b. a plurality of voltage storage means each adapted to have a different voltage thereacross for controlling said oscillator means to a discrete frequency;

c. switching means for selectively connecting one of said voltage storage means to the input of said oscillator means; and d. comparing means having an output connected to said voltage storage means and a plurality of inputs, said comparing means providing a signal at said output dependent upon the relationship of predetermined characteristics of signals applied to said inputs, reference means connected to one of said inputs of said comparing means for supplying a reference signal thereto, and means coupling the output of said oscillator means to one of said inputs of said comparing means.

4. Apparatus as set forth in claim 9 wherein the reference means includes a crystal controlled oscillator.

5. Apparatus as set forth in claim 4 wherein the coupling means includes circuitry connected to said switching means and programmed to provide a signal at the comparing means having approximately the same frequency as the reference means.

6. Apparatus as set forth in claim 5 wherein the comparing means includes a phase detector for supplying pulses to the voltage storage means which pulses have a width proportional to the phase error between the frequency of the output signal from the reference means and the frequency of the output signal from the coupling means.

7. Apparatus as set forth in claim 6 wherein the reference means is connected to the switching means for controlling the switching means to operate only at predetermined times relative to the output signal from the reference means.

* * * * *

UNITED STATES PATENT AND TRADEMARK OFFICE
CERTIFICATE OF CORRECTION

PATENT NO. : 3,729,688

DATED : April 24, 1973

INVENTOR(S) : Frank J. Cerny and Donald L. Linder

It is certified that error appears in the above-identified patent and that said Letters Patent are hereby corrected as shown below:

Claim 4, line 1, please delete "claim 9" and insert --claim 3--.

Signed and Sealed this

*eighth* Day of *June 1976*

[SEAL]

*Attest:*

RUTH C. MASON
*Attesting Officer*

C. MARSHALL DANN
*Commissioner of Patents and Trademarks*